(12) United States Patent
Ho et al.

(10) Patent No.: US 12,525,566 B2
(45) Date of Patent: Jan. 13, 2026

(54) SEMICONDUCTOR PACKAGE AND FABRICATION METHOD THEREOF

(71) Applicant: UNITED MICROELECTRONICS CORP., Hsin-Chu (TW)

(72) Inventors: Kai-Kuang Ho, Hsinchu (TW); Yu-Jie Lin, Taichung (TW); Yi-Feng Hsu, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 594 days.

(21) Appl. No.: 17/980,571

(22) Filed: Nov. 4, 2022

(65) Prior Publication Data

US 2024/0120306 A1 Apr. 11, 2024

(30) Foreign Application Priority Data

Oct. 11, 2022 (CN) .......................... 202211240541.2

(51) Int. Cl.
*H01L 23/498* (2006.01)
*H01L 23/00* (2006.01)
*H01L 25/065* (2023.01)

(52) U.S. Cl.
CPC .......... *H01L 24/32* (2013.01); *H01L 23/4985* (2013.01); *H01L 24/08* (2013.01); *H01L 24/83* (2013.01); *H01L 24/94* (2013.01); *H01L 24/95* (2013.01); *H01L 25/0657* (2013.01); *H01L 2224/08145* (2013.01); *H01L 2224/08238* (2013.01); *H01L 2224/32054* (2013.01); *H01L 2224/32225* (2013.01); *H01L 2224/80203* (2013.01); *H01L 2224/80895* (2013.01); *H01L 2224/83203* (2013.01); *H01L 2225/06524* (2013.01); *H01L 2225/06527* (2013.01); *H01L 2225/06568* (2013.01); *H01L 2924/15151* (2013.01); *H01L 2924/182* (2013.01)

(58) Field of Classification Search
CPC .. H01L 24/32; H01L 23/4985; H01L 25/0657
See application file for complete search history.

(56) References Cited

U.S. PATENT DOCUMENTS

| 8,067,514 | B2 * | 11/2011 | Miyauchi | C09J 4/00 252/514 |
| 8,715,833 | B2 * | 5/2014 | Yamada | C09J 7/10 156/332 |
| 10,236,408 | B2 | 3/2019 | Yamazaki | |
| 2012/0292082 | A1 * | 11/2012 | Miyauchi | B32B 7/12 174/250 |

(Continued)

*Primary Examiner* — Dale E Page
*Assistant Examiner* — Wilner Jean Baptiste
(74) *Attorney, Agent, or Firm* — Winston Hsu

(57) ABSTRACT

A semiconductor package includes a die stack including a first semiconductor die having a first interconnect structure, and a second semiconductor die having a second interconnect structure direct bonding to the first interconnect structure of the first semiconductor die. The second interconnect structure includes connecting pads disposed in a peripheral region around the first semiconductor die. First connecting elements are disposed on the connecting pads, respectively. A substrate includes second connecting elements on a mounting surface of the substrate. The first connecting elements are electrically connected to the second connecting elements through an anisotropic conductive structure.

18 Claims, 19 Drawing Sheets

(56) References Cited

U.S. PATENT DOCUMENTS

2013/0033283 A1* 2/2013 Wu .................... G01R 1/07342
　　　　　　　　　　　　　　　　　　　　　324/756.03
2014/0291842 A1* 10/2014 Ang .................... H01L 25/0657
　　　　　　　　　　　　　　　　　　　　　257/738

* cited by examiner

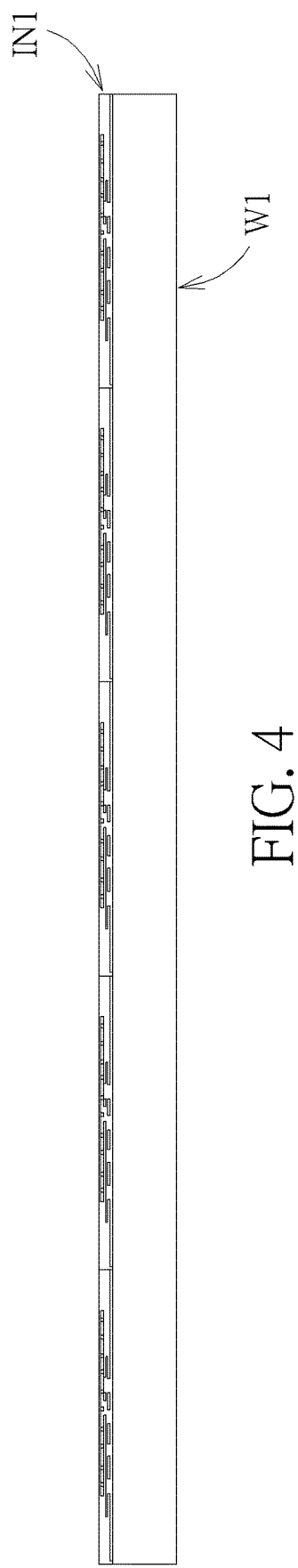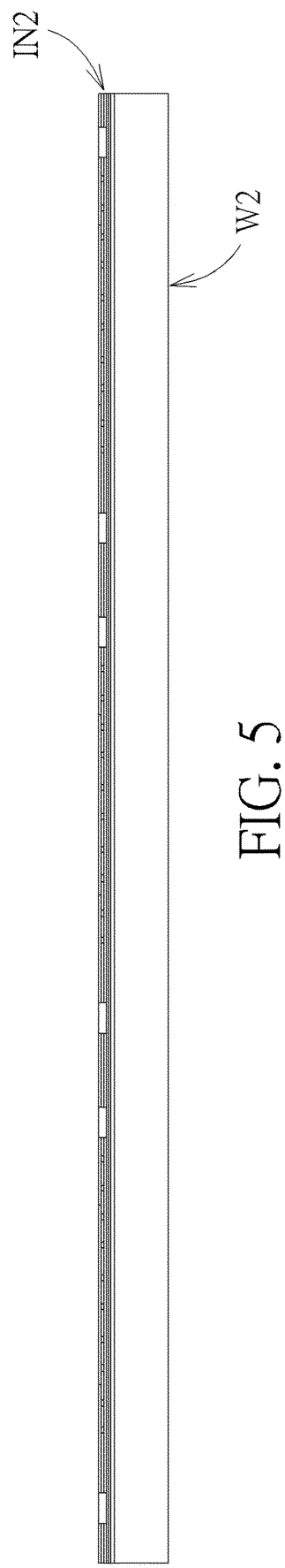
FIG. 4
FIG. 5

SEMICONDUCTOR PACKAGE AND FABRICATION METHOD THEREOF

BACKGROUND OF THE INVENTION

1. Field of the Invention

The present invention relates to the field of semiconductor technology, in particular to a semiconductor package with a three-dimensional (3D) die stack and a manufacturing method thereof.

2. Description of the Prior Art

The current 3D die stacking mainly uses micro-bumps for chip connection, and then uses through-silicon vias (TSVs) to connect signals.

However, micro-bumps and TSVs add complexity and cost to the manufacturing process. In addition, the device performance in the chip will be affected by the TSV, so an additional keep out zone needs to be configured.

SUMMARY OF THE INVENTION

One object of the present invention is to provide an improved semiconductor package and its manufacturing method to solve the above-mentioned deficiencies or shortcomings of the prior art.

One aspect of the invention provides a semiconductor package including a die stack comprising a first semiconductor die having a first interconnect structure, and a second semiconductor die having a second interconnect structure direct bonding to the first interconnect structure of the first semiconductor die. The second interconnect structure comprises a plurality of connecting pads disposed in a peripheral region around the first semiconductor die. A plurality of first connecting elements are disposed on the plurality of connecting pads, respectively. A substrate comprising a plurality of second connecting elements are disposed on a mounting surface of the substrate. The plurality of first connecting elements are electrically connected to the plurality of second connecting elements through an anisotropic conductive structure.

According to some embodiments, the anisotropic conductive structure is disposed between the plurality of first connecting elements and the plurality of second connecting elements.

According to some embodiments, the anisotropic conductive structure comprises an anisotropic conductive film.

According to some embodiments, the anisotropic conductive structure comprises an anisotropic conductive paste.

According to some embodiments, the substrate comprises a package substrate.

According to some embodiments, the substrate comprises a flexible printed circuit (FPC) substrate.

According to some embodiments, the plurality of first connecting elements comprise a front side metal layer.

According to some embodiments, the front side metal layer comprises copper, nickel, gold or any combinations thereof.

According to some embodiments, the anisotropic conductive structure covers sidewalls of the plurality of first connecting elements and sidewalls of the plurality of second connecting elements.

According to some embodiments, the anisotropic conductive structure is in direct contact with the second semiconductor die having the second interconnect structure.

Another aspect of the invention provides a method for forming a semiconductor package.

A die stack is provided. The die stack comprises a first semiconductor die having a first interconnect structure, and a second semiconductor die having a second interconnect structure direct bonding to the first interconnect structure of the first semiconductor die. The second interconnect structure comprises a plurality of connecting pads disposed in a peripheral region around the first semiconductor die. A plurality of first connecting elements are formed on the plurality of connecting pads, respectively. A substrate is provided. The substrate comprises a plurality of second connecting elements disposed on a mounting surface of the substrate. The die stack is mounted onto the mounting surface of the substrate. The plurality of first connecting elements are electrically connected to the plurality of second connecting elements through an anisotropic conductive structure.

According to some embodiments, the anisotropic conductive structure is disposed between the plurality of second connecting elements and the plurality of second connecting elements.

According to some embodiments, the anisotropic conductive structure comprises an anisotropic conductive film.

According to some embodiments, the anisotropic conductive structure comprises an anisotropic conductive paste.

According to some embodiments, the substrate comprises a package substrate.

According to some embodiments, the substrate comprises a flexible printed circuit (FPC) substrate.

According to some embodiments, the plurality of first connecting elements comprise a front side metal layer.

According to some embodiments, the front side metal layer comprises copper, nickel, gold or any combinations thereof.

According to some embodiments, the anisotropic conductive structure covers sidewalls of the plurality of first connecting elements and sidewalls of the plurality of second connecting elements.

According to some embodiments, the anisotropic conductive structure is in direct contact with the second semiconductor die having a second interconnect structure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 4 to FIG. 11 are schematic diagrams illustrating a method for fabricating a semiconductor package according to an embodiment of the present invention.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

Figure 1:
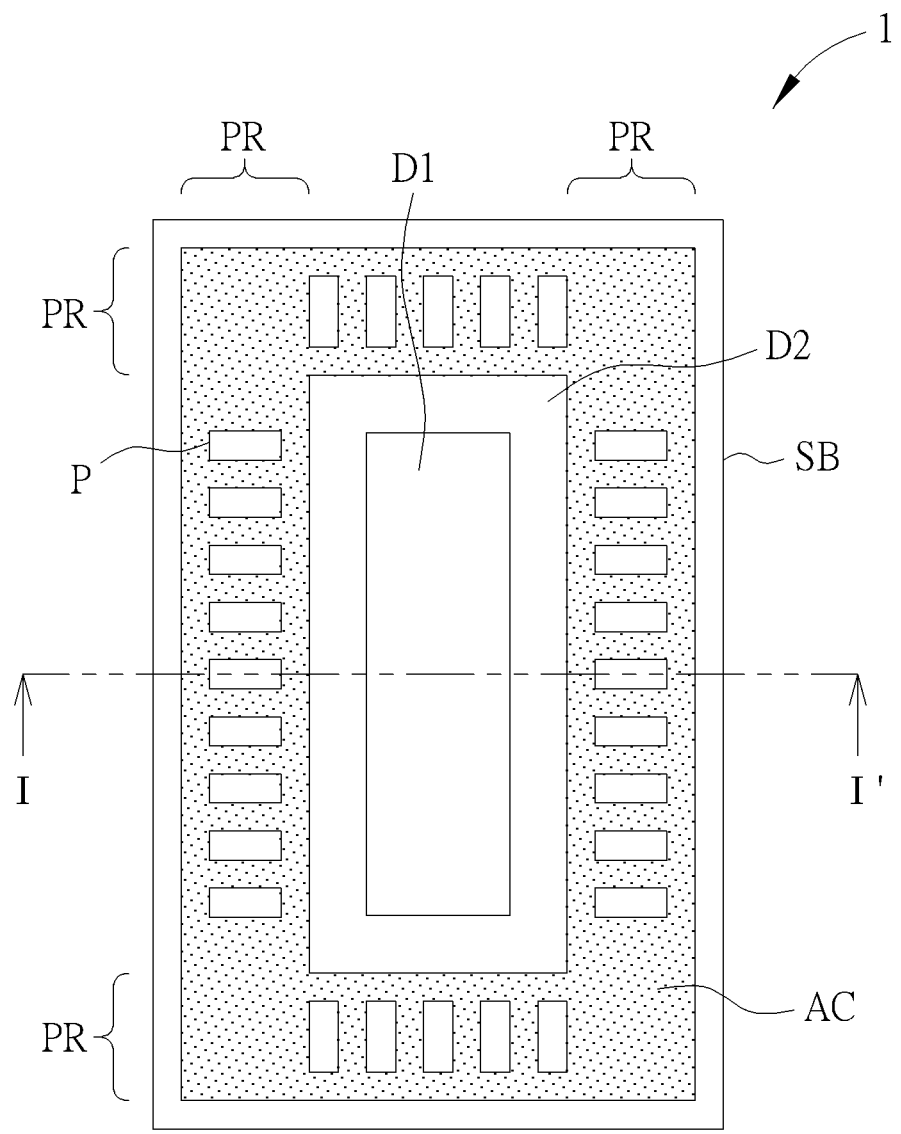
FIG. 1 is a bottom perspective view of a semiconductor package according to an embodiment of the present invention.
Figure 2:
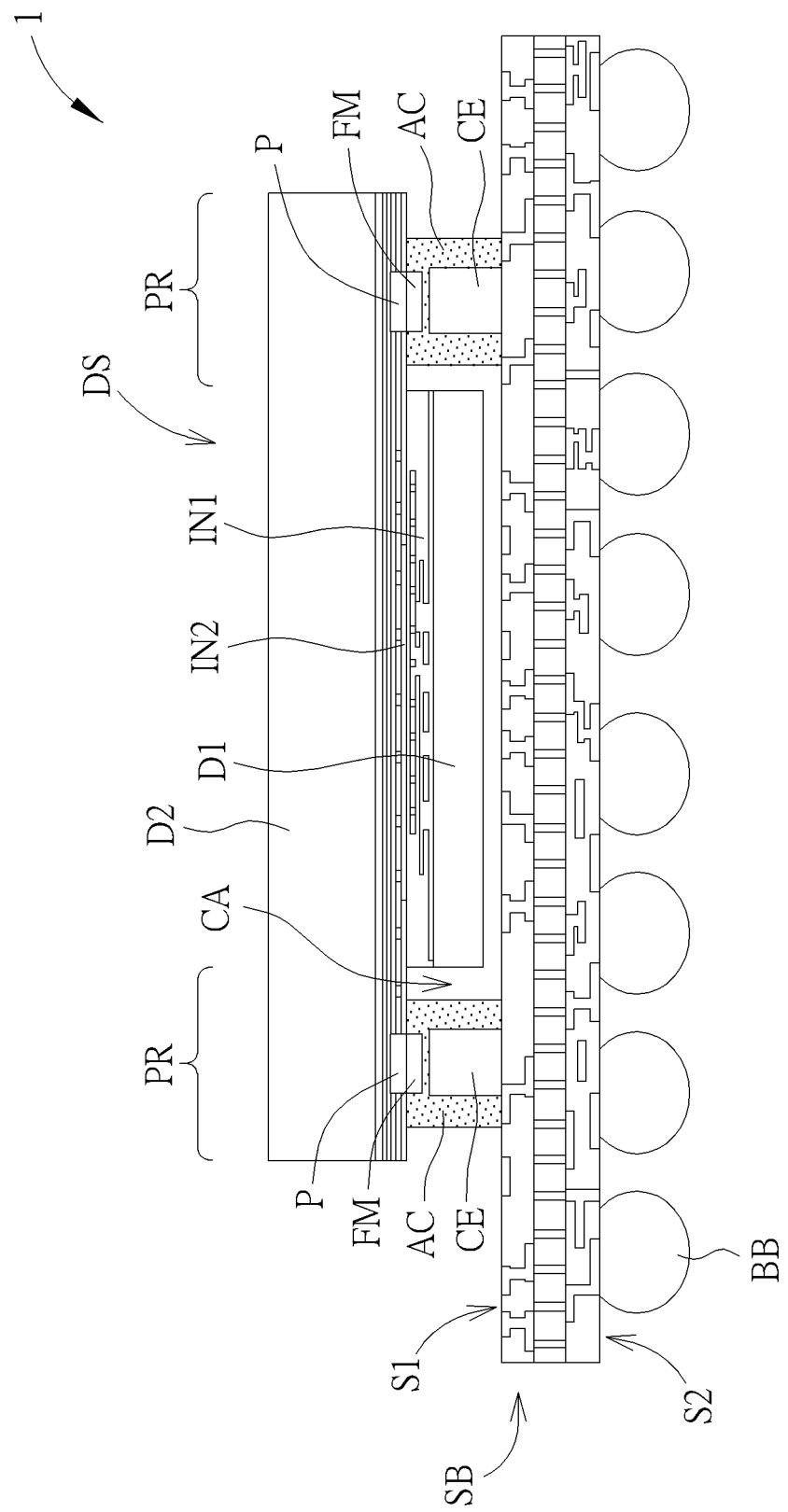
FIG. 2 is a schematic cross-sectional view of the semiconductor package shown along line I-I' in FIG. 1.

Please refer to FIG. 1 and FIG. 2, wherein FIG. 1 is a bottom perspective view of a semiconductor package according to an embodiment of the present invention, and FIG. 2 is a schematic cross-sectional view of the semiconductor package taken along line I-I' in FIG. 1. As shown in FIG. 1 and FIG. 2, the semiconductor package 1 includes a die stack DS including a first semiconductor die D1 having a first interconnect structure IN1 and a second semiconductor die D2 having a second interconnect structure IN2. The first semiconductor die D1 and the second semiconductor die D2 may be integrated circuit chips with different functions. According to an embodiment of the present invention, the first semiconductor die D1 and the second semiconductor die D2 are connected to each other through a direct bonding technique, that is, the second interconnect structure IN2 is directly bonded to the first semiconductor interconnect structure IN1 of the first semiconductor die D1. No metal bumps are required between the first interconnect structure IN1 and the second interconnect structure IN2. More specifically, the copper pads on the first interconnect structure IN1 and the copper pads on the second interconnect structure IN2 are interconnected through a Cu—Cu direct bonding technique.

According to an embodiment of the present invention, the second interconnect structure IN2 includes a plurality of connecting pads P disposed within the peripheral region PR in proximity to the first semiconductor die D1. According to an embodiment of the present invention, each connecting pad P is provided and covered with a first connecting element FM. According to an embodiment of the present invention, the first connecting element FM may include a front side metal layer formed by an electroplating process or an electroless plating process, which may comprise copper, nickel, gold, or any combination thereof, but is not limited thereto.

According to an embodiment of the present invention, the die stack DS is mounted on the mounting surface S1 of the substrate SB. For example, the substrate SB may include a package substrate. A plurality of second connecting elements CE are provided on the mounting surface S1 of the substrate SB. The location of the second connecting element CE corresponds to the first connecting element FM on the second interconnect structure IN2 of the second semiconductor die D2.

According to an embodiment of the present invention, the first connecting element FM is electrically connected to the second connecting element CE through the anisotropic conductive structure AC through a thermal compression bonding (TCB) technology. According to an embodiment of the present invention, the anisotropic conductive structure AC is disposed between the first connecting element FM and the second connecting element CE. According to an embodiment of the present invention, the anisotropic conductive structure AC includes an anisotropic conductive film. According to another embodiment of the present invention, the anisotropic conductive structure AC includes an anisotropic conductive paste.

According to an embodiment of the present invention, as shown in FIG. 2, the anisotropic conductive structure AC covers the sidewalls of the first connecting element FM and the sidewalls of the second connecting element CE. According to an embodiment of the present invention, the anisotropic conductive structure AC is in direct contact with the second semiconductor die D2 having the second interconnect structure IN2. According to an embodiment of the present invention, a sealed cavity CA may be formed between the die stack DS, the anisotropic conductive structure AC, and the substrate SB. According to an embodiment of the present invention, a plurality of solder balls BB may be formed on the bottom surface S2 of the substrate SB.

Figure 3:
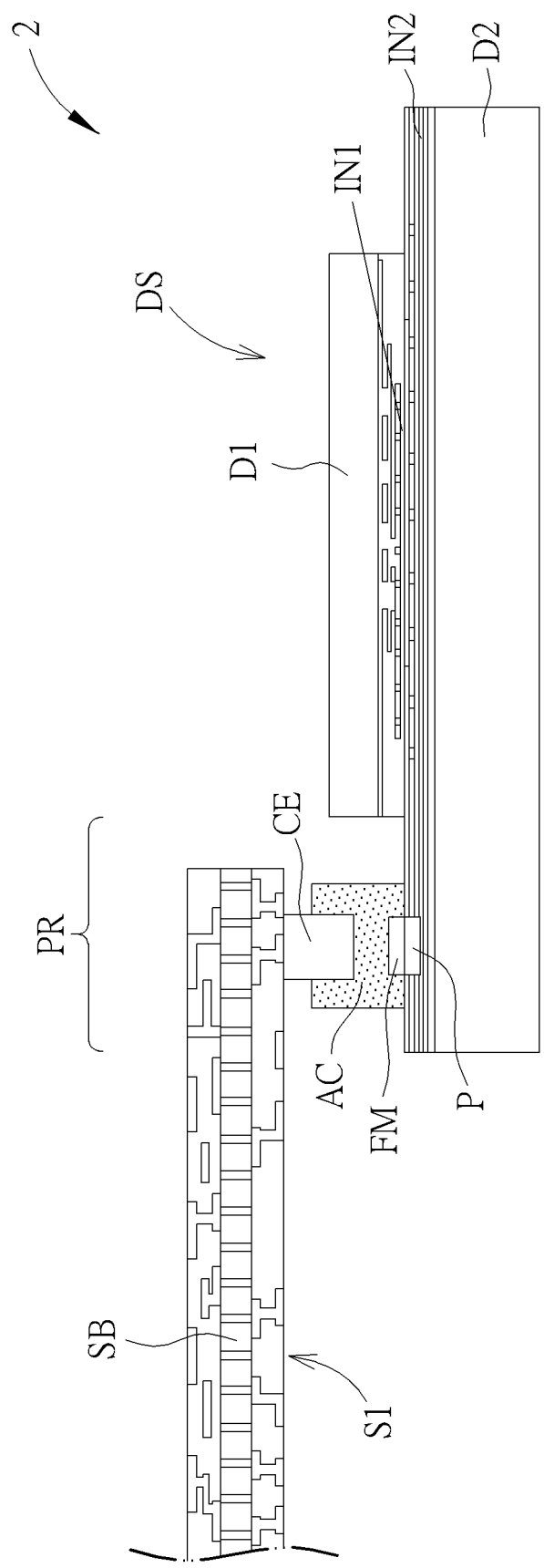
FIG. 3 is a schematic cross-sectional view of a semiconductor package according to another embodiment of the present invention.

FIG. 3 is a schematic cross-sectional view of a semiconductor package according to another embodiment of the present invention, wherein like layers, regions or elements are designated by like numeral numbers or labels. As shown in FIG. 3, likewise, the semiconductor package 2 includes a die stack DS including a first semiconductor die D1 having a first interconnect structure IN1 and a second semiconductor die D2 having a second interconnect structure IN2. According to an embodiment of the present invention, the first semiconductor die D1 and the second semiconductor die D2 are connected to each other through a direct bonding technique, that is, the second interconnect structure IN2 is directly bonded to the first interconnect structure IN1 of the first semiconductor die D1. No metal bump is required between the first interconnect structure IN1 and the second interconnect structure IN2.

According to an embodiment of the present invention, the second interconnect structure IN2 includes a plurality of connecting pads P disposed within the peripheral region PR in proximity to the first semiconductor die D1. According to an embodiment of the present invention, each connecting pad P is provided and covered with a first connecting element FM. According to an embodiment of the present invention, the first connecting element FM may include a front side metal layer, for example, copper, nickel, gold, or any combination thereof, formed in an electroplating process or an electroless plating process.

According to an embodiment of the present invention, the die stack DS is mounted on the mounting surface S1 of the substrate SB, for example, the substrate SB may be a flexible printed circuit (FPC) substrate. A plurality of second connecting elements CE may be provided on the mounting surface S1 of the substrate SB. The location of the second connecting element CE corresponds to the first connecting element FM on the second interconnect structure IN2 of the second semiconductor die D2.

According to an embodiment of the present invention, the first connecting element FM is electrically connected to the second connecting element CE through the anisotropic conductive structure AC by using thermo-compression bonding (TCB) technology. According to an embodiment of the present invention, the anisotropic conductive structure AC is disposed between the first connecting element FM and the second connecting element CE. According to an embodiment of the present invention, the anisotropic conductive structure AC includes an anisotropic conductive film (ACF). According to another embodiment of the present invention, the anisotropic conductive structure AC includes an anisotropic conductive paste (ACP). According to an embodiment of the present invention, the anisotropic conductive structure AC covers the sidewalls of the first connecting element FM and the sidewalls of the second connecting element CE. According to an embodiment of the present invention, the anisotropic conductive structure AC is in direct contact with the second semiconductor die D2 having the second interconnect structure IN2.

The semiconductor package structure of the present invention employs anisotropic conductive structure AC, such as anisotropic conductive film or anisotropic conductive paste (ACP), and thermal-compression bonding (TCB) technology to form the hybrid bonding chip. The present invention is cost effective and is suitable for low pin count applications, such as Display Driver Integrated Circuit (DDIC).

Figure 6:
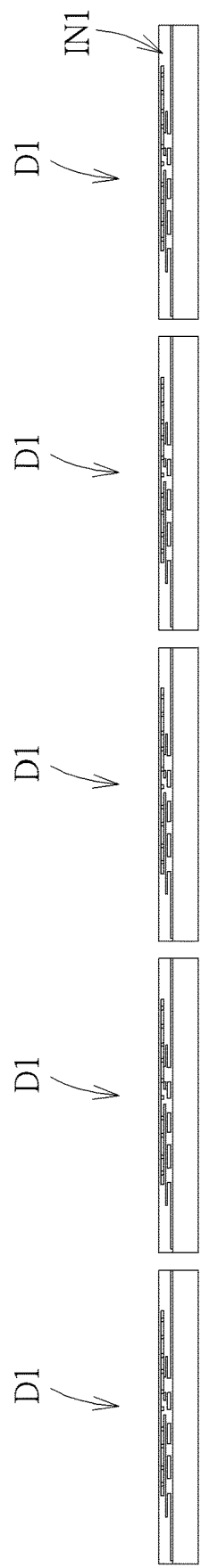

FIG. 4 to FIG. 11 are schematic diagrams illustrating a method for fabricating a semiconductor package according to an embodiment of the present invention, wherein like layers, regions or elements are designated by like numeral numbers or labels. As shown in FIG. 4, an integrated circuit is formed on the wafer W1 including the first interconnect structure IN1. As shown in FIG. 5, an integrated circuit is formed on the wafer W2 including the second interconnect structure IN2. As shown in FIG. 6, next, a thinning process is performed on the wafer W1, and then the wafer W1 is cut into a plurality of first semiconductor dies D1.

Figure 7:
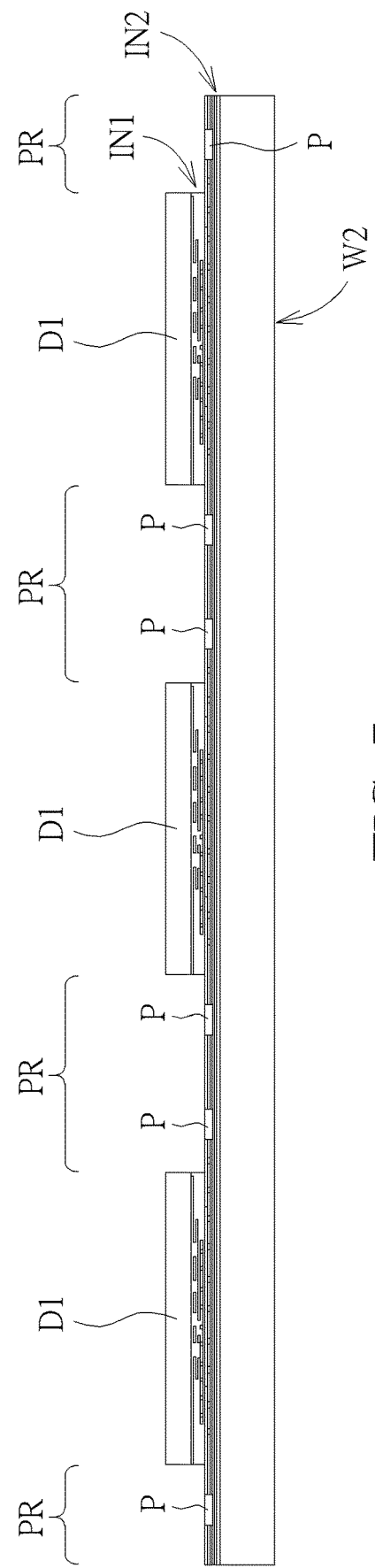

As shown in FIG. 7, the first semiconductor die D1 is flipped, and then the first interconnect structure IN1 of the first semiconductor die D1 and the second interconnect structure IN2 on the wafer W2 are connected to each other through direct bonding technology. The second interconnect structure IN2 includes a plurality of connecting pads P disposed within the peripheral region PR in proximity to the first semiconductor die D1.

Figure 8:
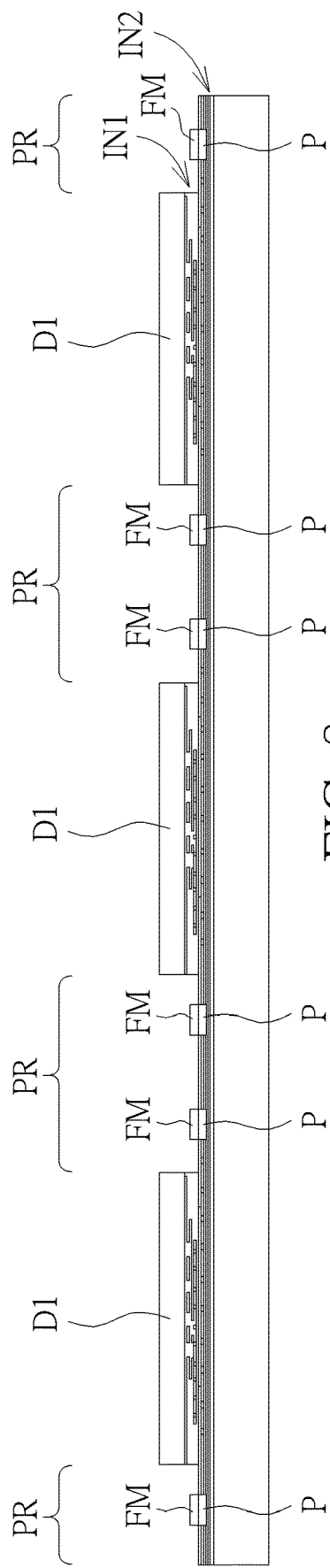

As shown in FIG. 8, the first connecting element FM is formed on each connecting pad P. According to an embodiment of the present invention, the first connecting element FM may include a front side metal layer, for example, copper, nickel, gold, or any combination thereof, formed in an electroplating process or an electroless plating process.

Figure 9:
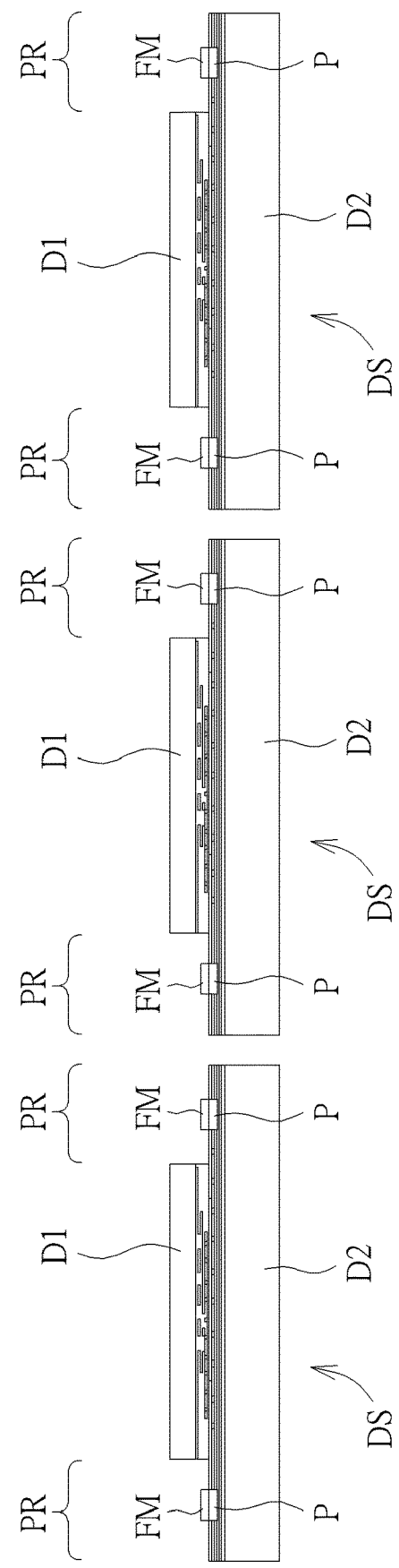

As shown in FIG. 9, a wafer dicing process is performed to form a plurality of die stacks DS in which the first semiconductor die D1 and the second semiconductor die D2 are directly bonded.

Figure 10:
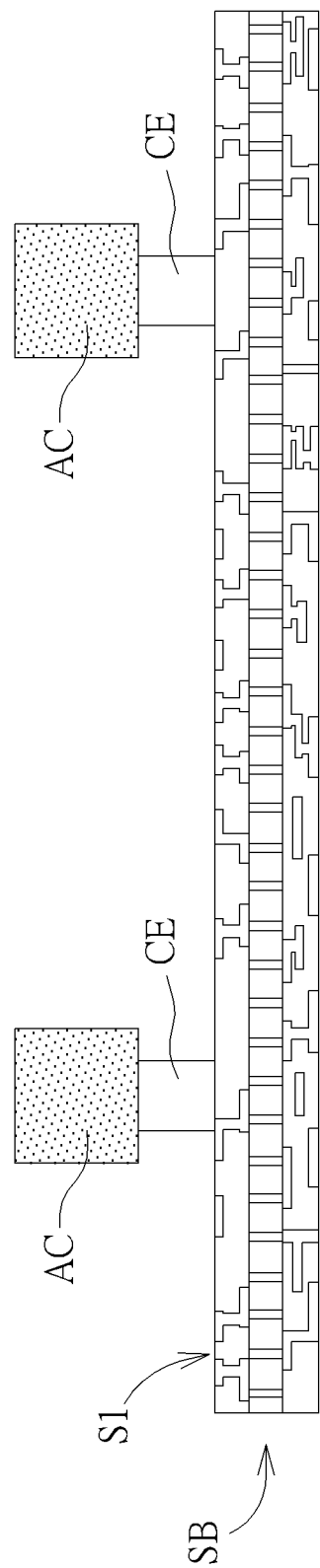

As shown in FIG. 10, a substrate SB, for example, a package substrate, is provided. A plurality of second connecting elements CE may be provided on the mounting surface S1 of the substrate SB. Subsequently, an anisotropic conductive structure AC is formed on the second connecting element CE. The anisotropic conductive structure AC may include an anisotropic conductive film or an anisotropic conductive paste.

Figure 11:
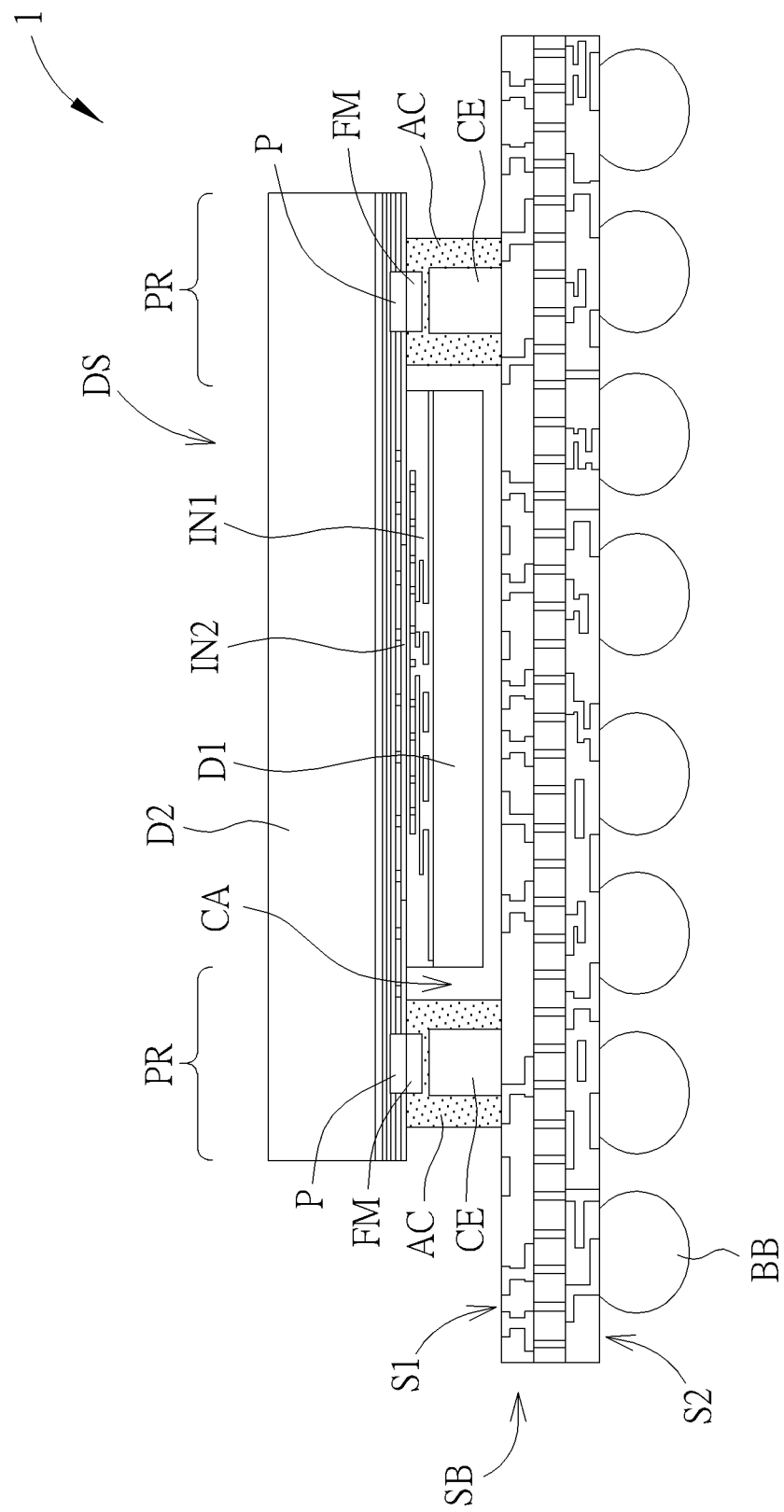

As shown in FIG. 11, the die stack DS in FIG. 9 is flipped, and the location of the second connecting element CE on the substrate SB corresponds to the first connecting element FM on the second interconnect structure IN2 of the second semiconductor die D2. The first connecting element FM is electrically connected to the second connecting element CE through the anisotropic conductive structure AC by using thermo-compression bonding (TCB) technology. According to an embodiment of the present invention, the anisotropic conductive structure AC is disposed between the first connecting element FM and the second connecting element CE. According to an embodiment of the present invention, the anisotropic conductive structure AC covers the sidewalls of the first connecting element FM and the sidewalls of the second connecting element CE. According to an embodiment of the present invention, the anisotropic conductive structure AC is in direct contact with the second semiconductor die D2 having the second interconnect structure IN2. Finally, solder balls BB are formed on the bottom surface S2 of the substrate SB. A sealed cavity CA may be formed between the die stack DS, the anisotropic conductive structure AC and the substrate SB.

Figure 12:
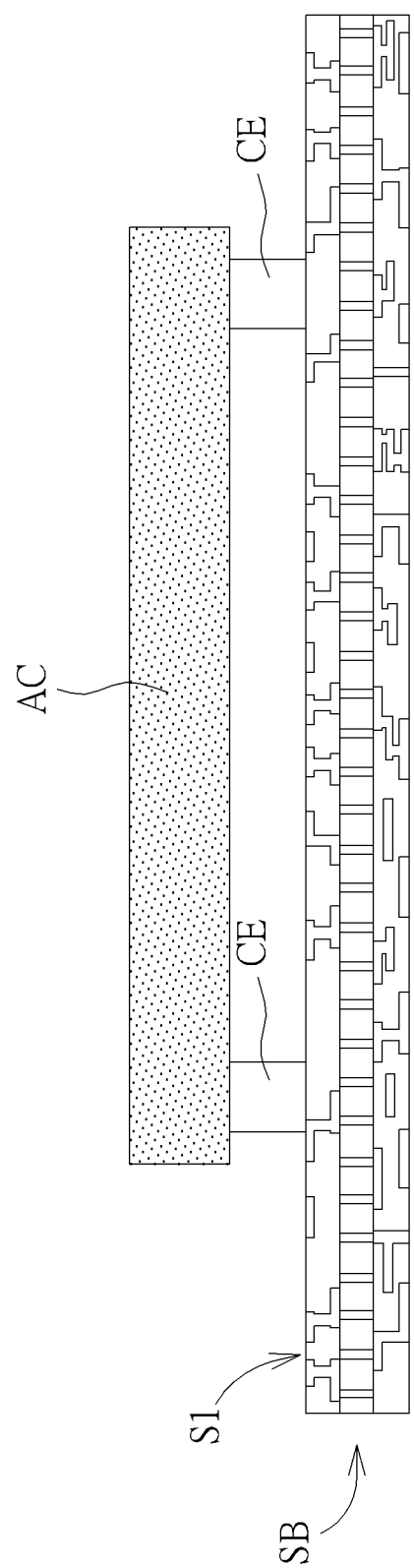
FIG. 12 to FIG. 13 are schematic diagrams illustrating a method for fabricating a semiconductor package according to another embodiment of the present invention.
Figure 13:
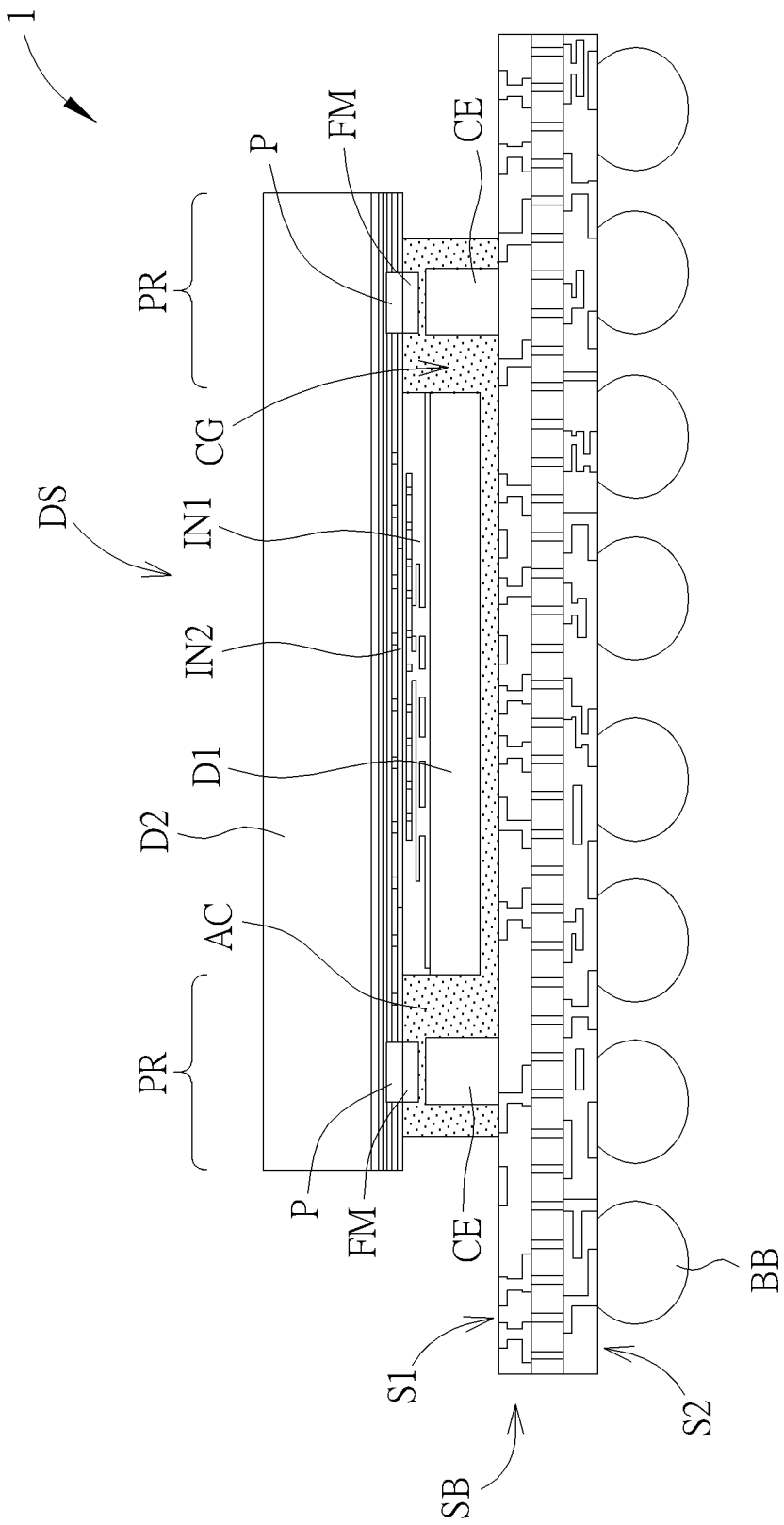

FIG. 12 to FIG. 13 are schematic diagrams illustrating a method for fabricating a semiconductor package according to another embodiment of the present invention, wherein like layers, regions or elements are designated by like numeral numbers or labels. As shown in FIG. 12, an anisotropic conductive structure AC is formed on the second connecting element CE of the substrate SB, wherein the anisotropic conductive structure AC can span between the two second connecting elements CE. The anisotropic conductive structure AC may include an anisotropic conductive film or an anisotropic conductive paste.

As shown in FIG. 13, by performing the thermo-compression bonding technology, the first connecting element FM is electrically connected to the second connecting element CE through the anisotropic conductive structure AC. According to an embodiment of the present invention, the anisotropic conductive structure AC is disposed between the first connecting element FM and the second connecting element CE. According to an embodiment of the present invention, the anisotropic conductive structure AC covers the sidewalls of the first connecting element FM and the sidewalls of the second connecting element CE. According to an embodiment of the present invention, the anisotropic conductive structure AC is in direct contact with the first semiconductor die D1 and the second semiconductor die D2. According to an embodiment of the present invention, the anisotropic conductive structure AC fills the gap CG between the die stack DS and the substrate SB. Finally, solder balls BB are formed on the bottom surface S2 of the substrate SB.

Figure 14:
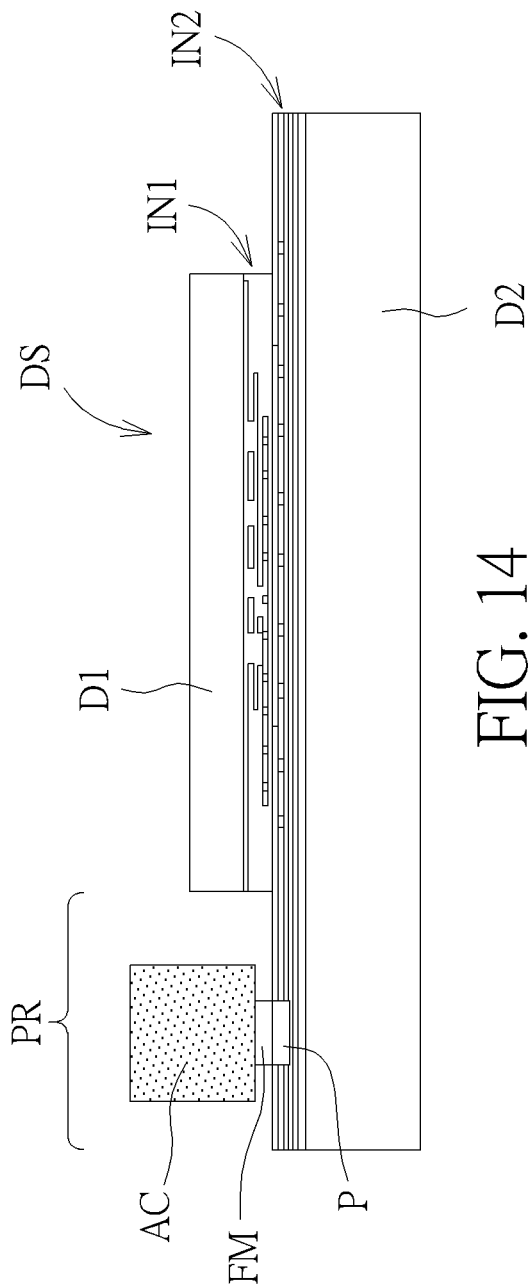
FIG. 14 to FIG. 15 are schematic diagrams illustrating a method for fabricating a semiconductor package according to yet another embodiment of the present invention.
Figure 15:
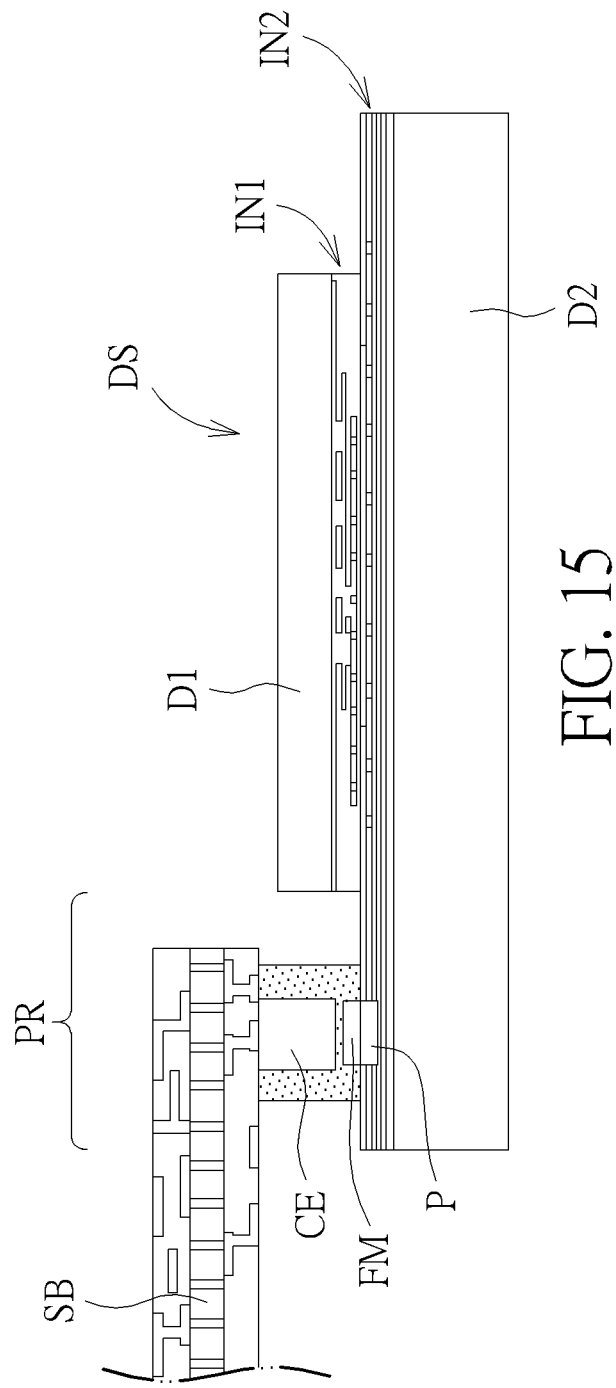

FIG. 14 to FIG. 15 are schematic diagrams illustrating a method for fabricating a semiconductor package according to yet another embodiment of the present invention, wherein like layers, regions or elements are designated by like numeral numbers or labels. As shown in FIG. 14, the second interconnect structure IN2 includes a plurality of connecting pads P disposed within the peripheral region PR in proximity to the first semiconductor die D1. A first connecting element FM is formed on each connecting pad P. According to an embodiment of the present invention, the first connecting element FM may include a front side metal layer, for example, copper, nickel, gold, or any combination thereof, formed in an electroplating process or an electroless plating process. Then, an anisotropic conductive structure AC is formed on the first connecting element FM. The anisotropic conductive structure AC may include an anisotropic conductive film or an anisotropic conductive paste.

As shown in FIG. 15, the first connecting element FM is electrically connected to the second connecting element CE of the substrate SB through the anisotropic conductive structure AC by performing thermo-compression bonding technology. The substrate SB, for example is a flexible printed circuit (FPC) substrate. According to an embodiment of the present invention, the anisotropic conductive structure AC is disposed between the first connecting element FM and the second connecting element CE. According to an embodiment of the present invention, the anisotropic conductive structure AC covers the sidewalls of the first connecting element FM and the sidewalls of the second connecting element CE. According to an embodiment of the present invention, the anisotropic conductive structure AC is in direct contact with the second semiconductor die D2.

Figure 16:
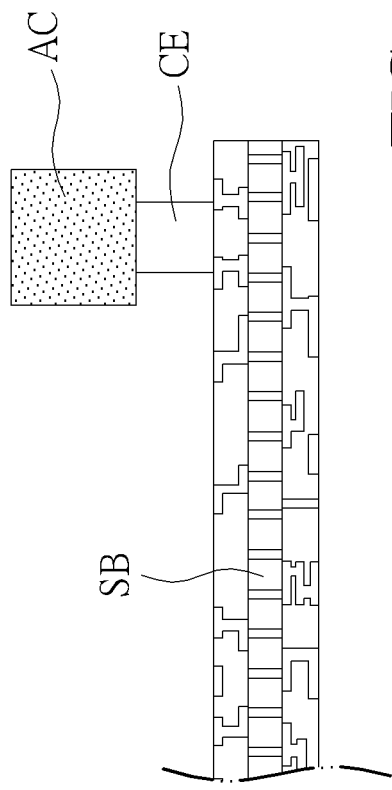
FIG. 16 to FIG. 17 are schematic diagrams illustrating a method for fabricating a semiconductor package according to yet another embodiment of the present invention.
Figure 17:
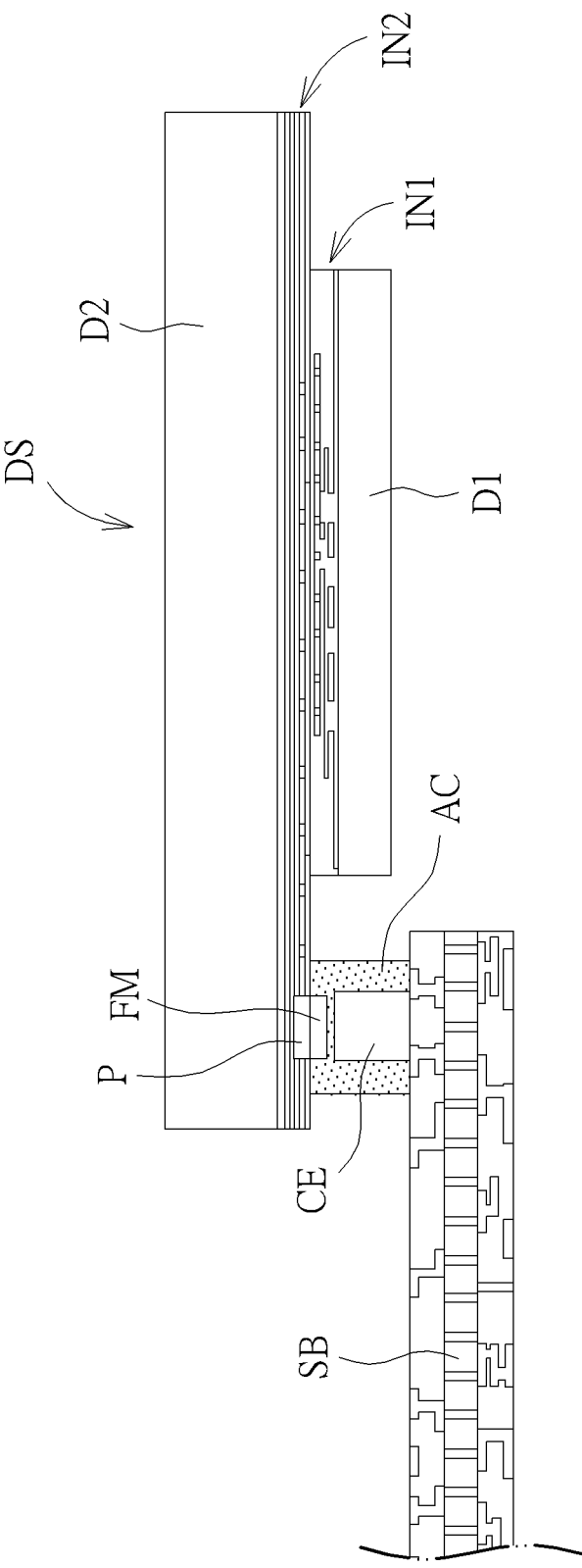

FIG. 16 to FIG. 17 are schematic diagrams illustrating a method for fabricating a semiconductor package according to yet another embodiment of the present invention, wherein like layers, regions or elements are designated by like numeral numbers or labels. As shown in FIG. 16, an anisotropic conductive structure AC is formed on a second connecting element CE of a substrate SB, for example, a flexible printed circuit (FPC) substrate, wherein the anisotropic conductive structure AC may include anisotropic conductive structures film or anisotropic conductive paste.

As shown in FIG. 17, by performing the thermo-compression bonding technology, the first connecting element FM of the die stack DS is electrically connected to the second connecting element CE through the anisotropic conductive structure AC. According to an embodiment of the present invention, the anisotropic conductive structure AC is disposed between the first connecting element FM and the second connecting element CE. According to an embodiment of the present invention, the anisotropic conductive structure AC covers the sidewalls of the first connecting element FM and the sidewalls of the second connecting element CE. According to an embodiment of the present invention, the anisotropic conductive structure AC is in direct contact with the first semiconductor die D1 and the second semiconductor die D2.

Figure 18:
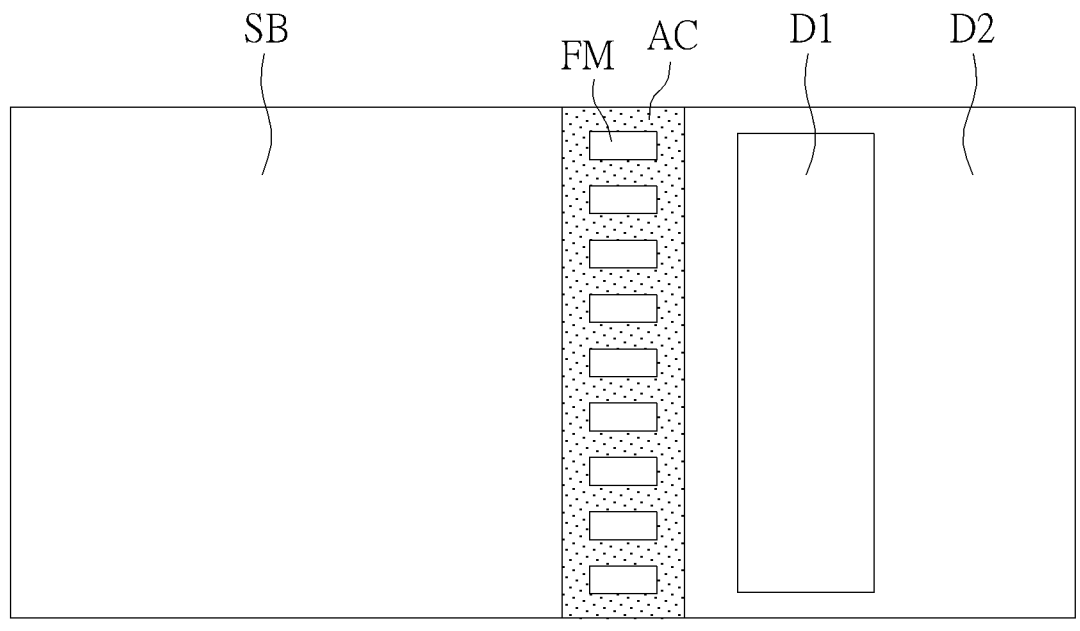
FIG. 18 is a schematic layout diagram of the semiconductor package in FIG. 17.

Please refer to FIG. 18, which is a schematic diagram of the layout of the semiconductor package in FIG. 17. As shown in FIG. 18, the substrate SB, for example, a flexible printed circuit (FPC) substrate is electrically connected to a single row of first connecting elements FM provided on a single side near the first semiconductor die D1 through an anisotropic conductive structure AC. The anisotropic conductive structure AC may be a strip pattern covering a single row of the first connecting elements FM.

Figure 19:
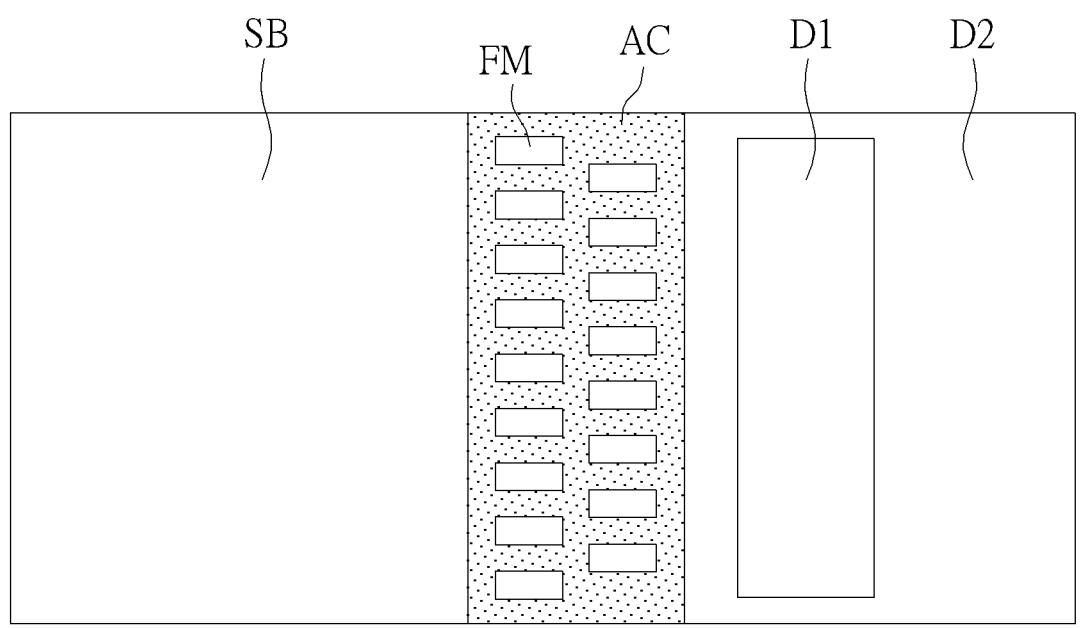
FIG. 19 illustrates another layout of a semiconductor package.

Please refer to FIG. 19, which illustrates another semiconductor package layout. As shown in FIG. 19, the substrate SB, for example, a flexible printed circuit (FPC) substrate, is electrically connected through an anisotropic conductive structure AC to double rows of first connecting elements FM disposed on one side close to the first semiconductor die D1, wherein the front-row first connecting elements FM and the rear-row first connecting elements FM may be staggered. The anisotropic conductive structure AC may be a strip pattern covering the double rows of the first connecting elements FM.

Figure 20:
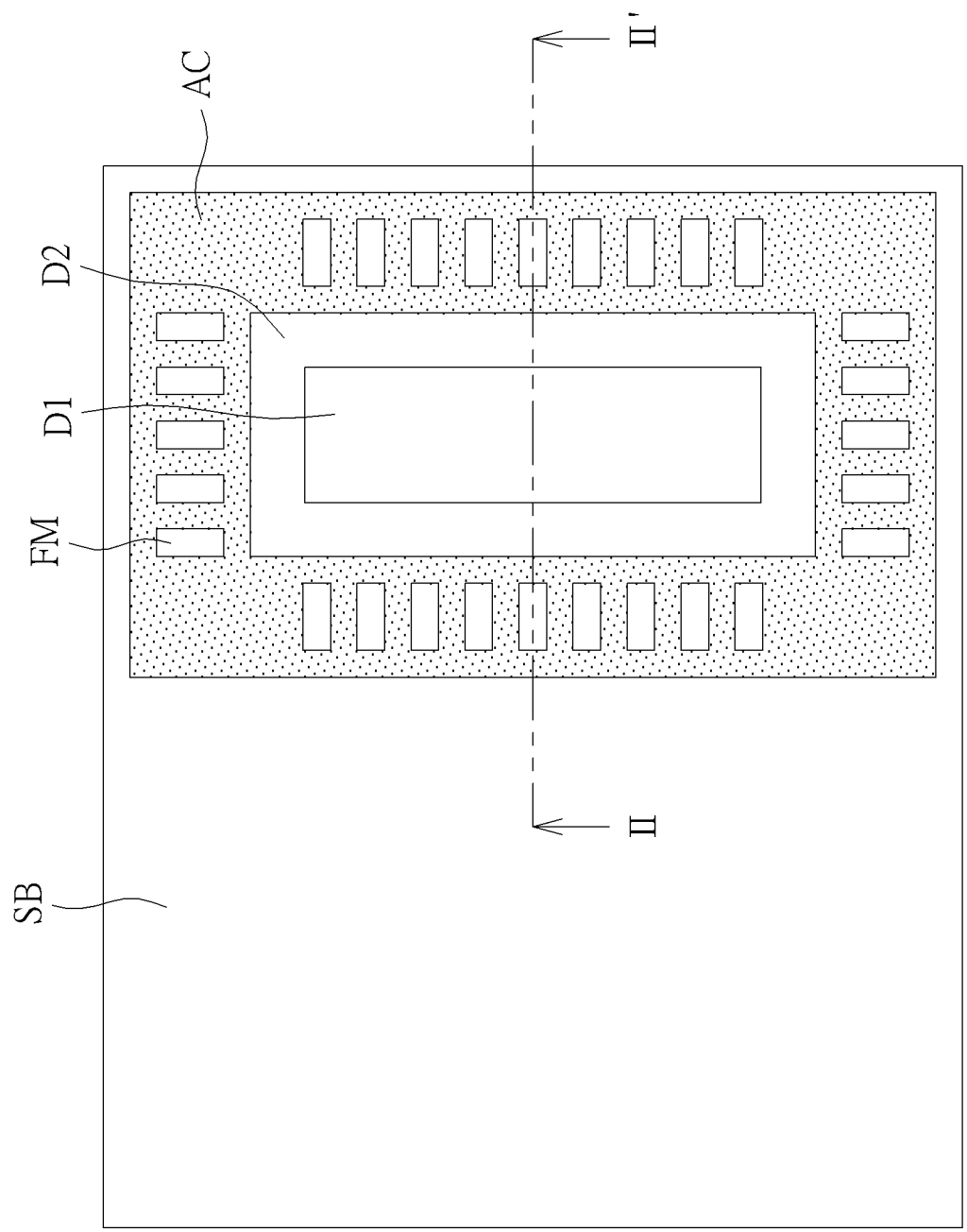
FIG. 20 illustrates another layout of a semiconductor package.
Figure 21:
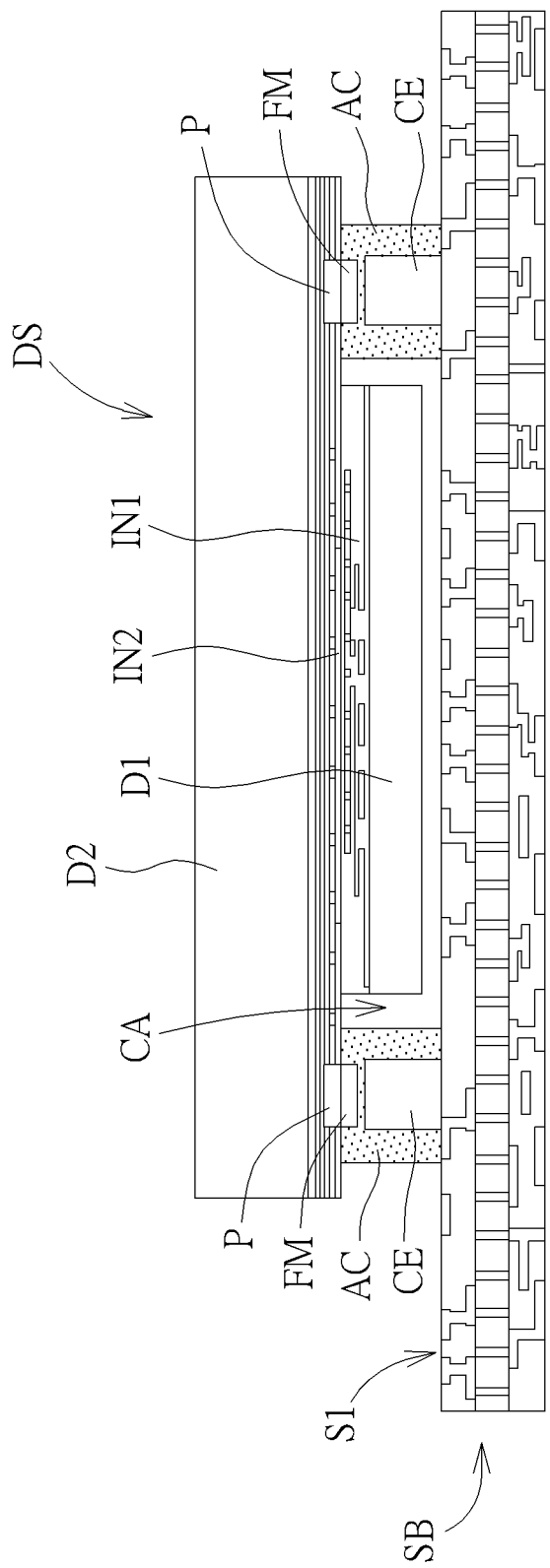
FIG. 21 is a schematic cross-sectional view taken along line II-II' in FIG. 20.

Please refer to FIG. 20 and FIG. 21, wherein FIG. 20 illustrates another layout of a semiconductor package, and FIG. 21 is a schematic cross-sectional view along line II-II' in FIG. 20. As shown in FIG. 20 and FIG. 21, the substrate SB, for example, a flexible printed circuit (FPC) substrate is electrically connected to single-row first connecting element FM disposed close to the four sides of the first semiconductor die D1 through the second connecting element CE and the anisotropic conductive structure AC. The. The anisotropic conductive structure AC may be an annular strip pattern covering a single row of the first connecting elements FM. A sealed cavity CA may be formed between the die stack DS, the anisotropic conductive structure AC and the substrate SB.

Figure 22:
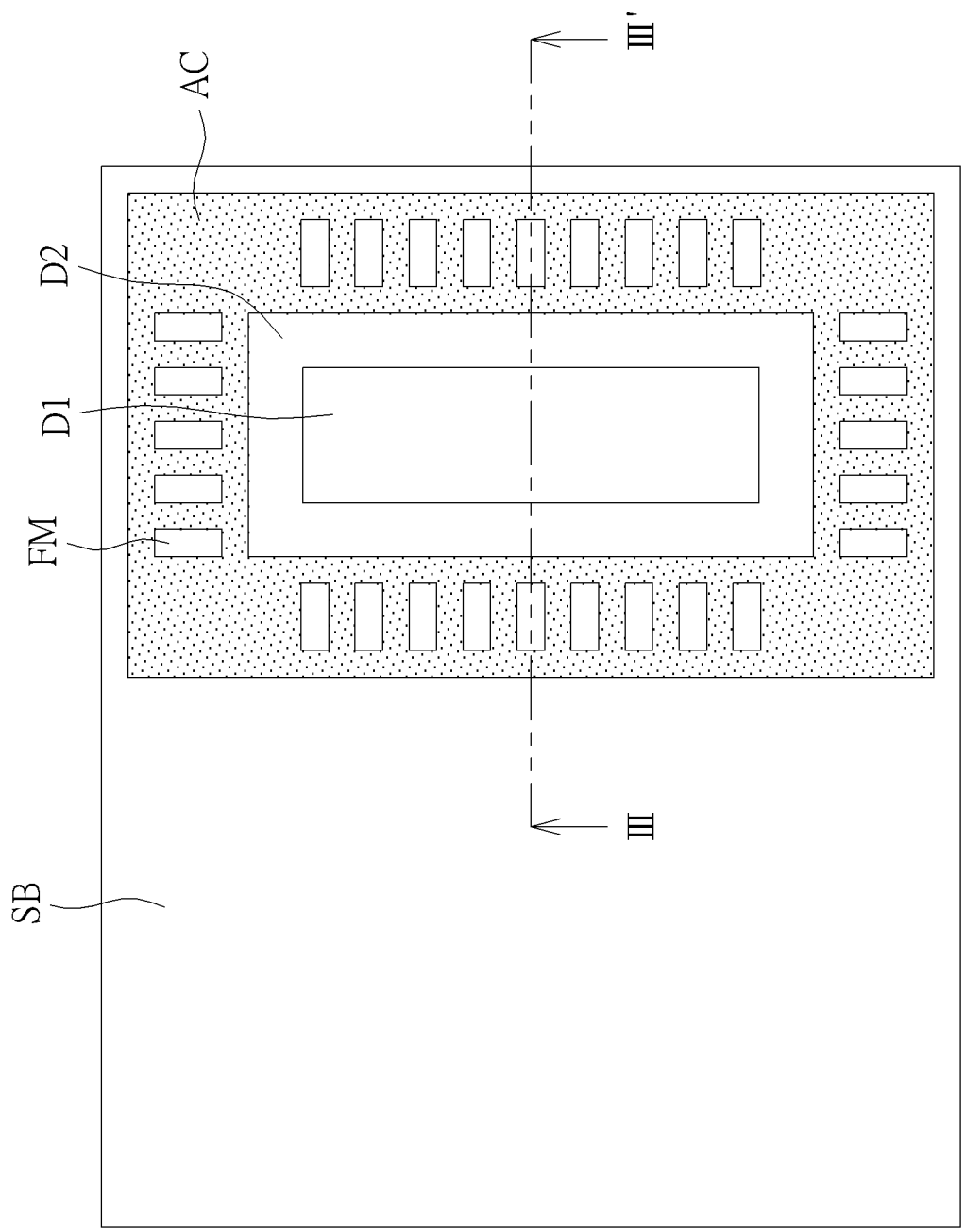
FIG. 22 illustrates another layout of a semiconductor package.
Figure 23:
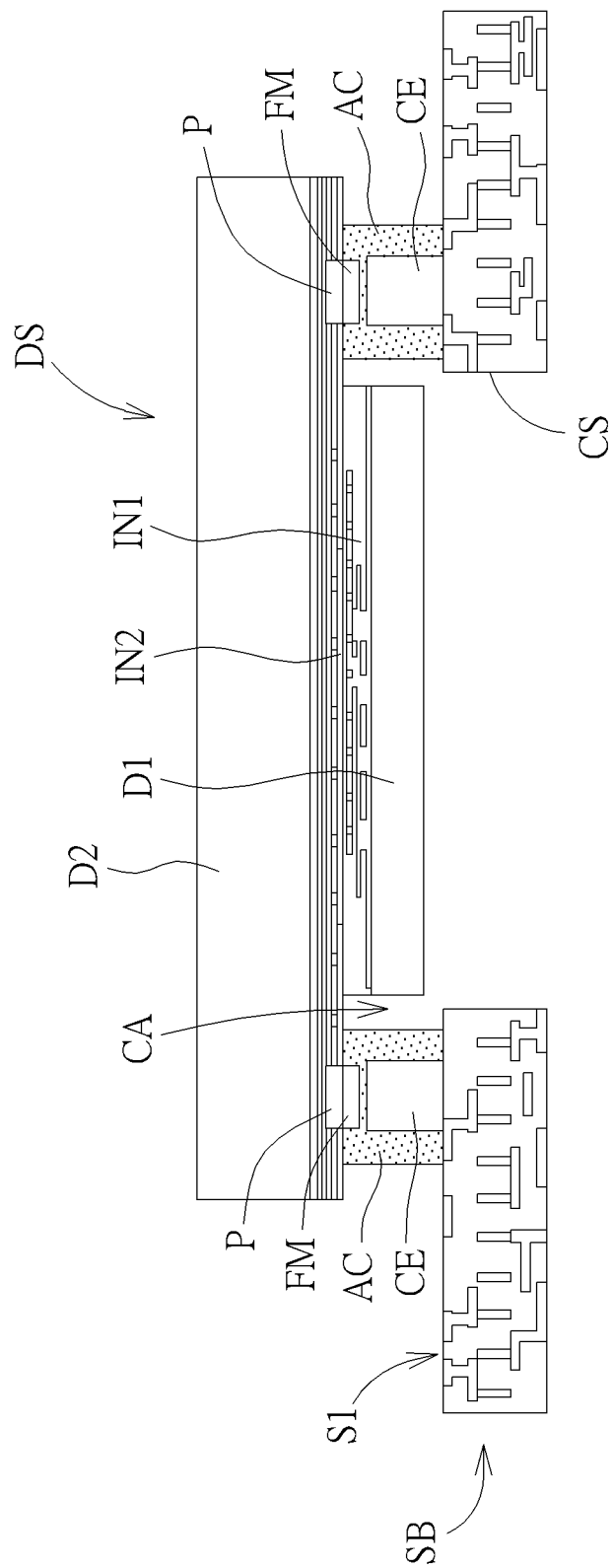
FIG. 23 is a schematic cross-sectional view taken along line III-III' in FIG. 22.

Please refer to FIG. 22 and FIG. 23, wherein FIG. 22 illustrates another layout of a semiconductor package, and FIG. 23 is a schematic cross-sectional view along line III-III' in FIG. 22. As shown in FIGS. 22 and 23, the substrate SB, for example, a flexible printed circuit (FPC) substrate is electrically connected to single-row first connecting element FM disposed close to the four sides of the first semiconductor die D1 through the second connecting element CE and the anisotropic conductive structure AC. The anisotropic conductive structure AC may be an annular strip pattern covering a single row of the first connecting elements FM. A through hole CS corresponding to the position of the die stack DS is formed in the substrate SB, which is connected with the cavity CA between the die stack DS, the anisotropic conductive structure AC and the substrate SB.

Figure 24:
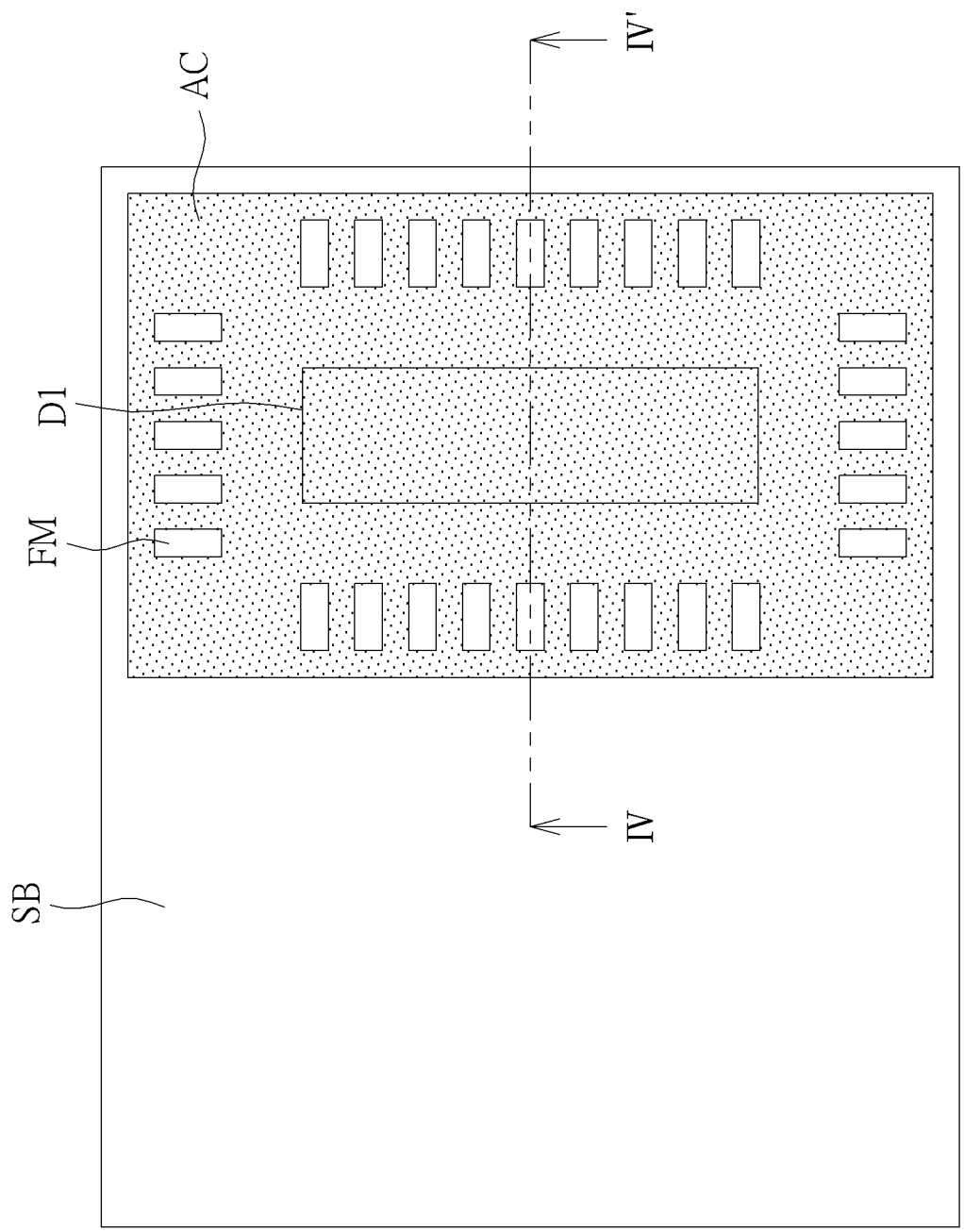
FIG. 24 illustrates another layout of a semiconductor package.
Figure 25:
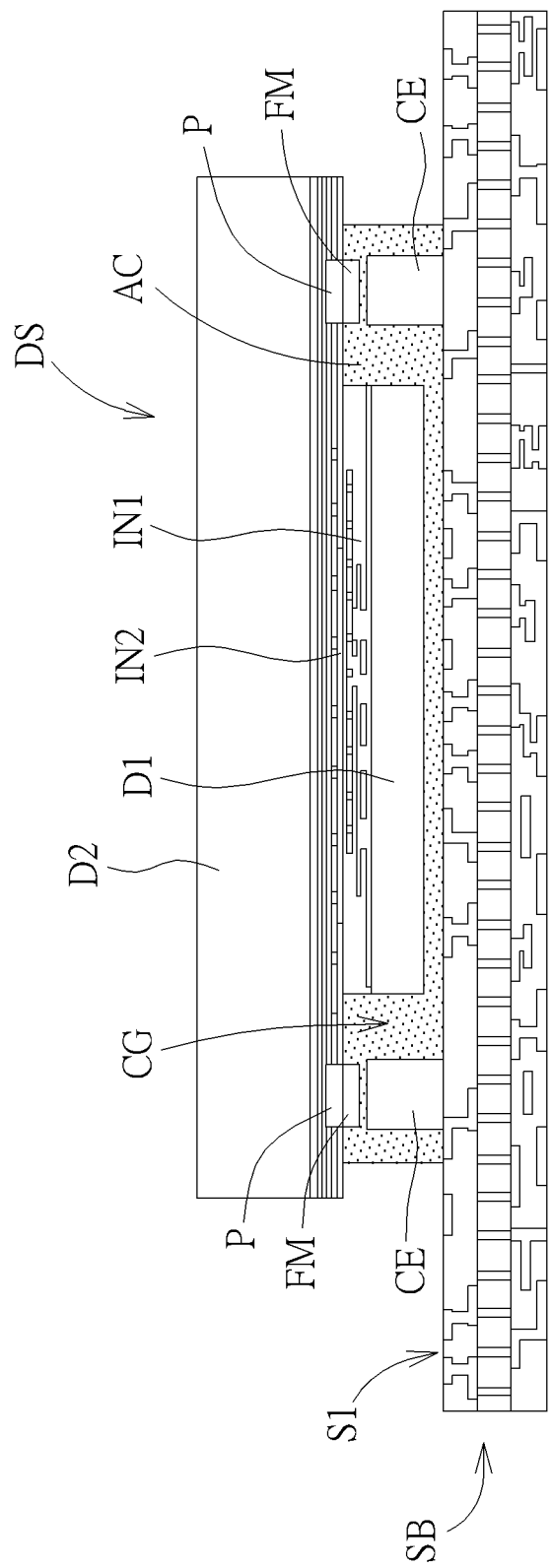
FIG. 25 is a schematic cross-sectional view taken along line IV-IV' in FIG. 24.

Please refer to FIG. 24 and FIG. 25, wherein FIG. 24 illustrates another layout of a semiconductor package, and FIG. 25 is a schematic cross-sectional view along line IV-IV' in FIG. 24. As shown in FIGS. 24 and 25, the substrate SB, for example, a flexible printed circuit (FPC) substrate is electrically connected to single-row first connecting elements FM disposed close to the four sides of the first semiconductor die D1 through the second connecting element CE and the anisotropic conductive structure AC. The. The anisotropic conductive structure AC may be a strip pattern covering the single row of the first connecting elements FM and the first semiconductor die D1 of the die stack DS. The gap CG between the die stack DS and the substrate SB is filled by the anisotropic conductive structure AC.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor package, comprising:
   a die stack comprising a first semiconductor die having a first interconnect structure, and a second semiconductor die having a second interconnect structure direct bonding to the first interconnect structure of the first semiconductor die, wherein the second interconnect structure comprises a plurality of connecting pads disposed in a peripheral region around the first semiconductor die;
   a plurality of first connecting elements disposed on the plurality of connecting pads, respectively; and
   a substrate comprising a plurality of second connecting elements disposed on a mounting surface of the substrate, wherein the plurality of first connecting elements are electrically connected to the plurality of second connecting elements through an anisotropic conductive structure, wherein the anisotropic conductive structure is disposed between the plurality of first connecting elements and the plurality of second connecting elements.

2. The semiconductor package according to claim 1, wherein the anisotropic conductive structure comprises an anisotropic conductive film.

3. The semiconductor package according to claim 1, wherein the anisotropic conductive structure comprises an anisotropic conductive paste.

4. The semiconductor package according to claim 1, wherein the substrate comprises a package substrate.

5. The semiconductor package according to claim 1, wherein the substrate comprises a flexible printed circuit (FPC) substrate.

6. The semiconductor package according to claim 1, wherein the plurality of first connecting elements comprise a front side metal layer.

7. The semiconductor package according to claim 6, wherein the front side metal layer comprises copper, nickel, gold or any combinations thereof.

8. The semiconductor package according to claim 1, wherein the anisotropic conductive structure covers sidewalls of the plurality of first connecting elements and sidewalls of the plurality of second connecting elements.

9. The semiconductor package according to claim 1, wherein the anisotropic conductive structure is in direct contact with the second semiconductor die having the second interconnect structure.

10. A method for forming a semiconductor package, comprising:
   providing a die stack comprising a first semiconductor die having a first interconnect structure, and a second semiconductor die having a second interconnect structure direct bonding to the first interconnect structure of the first semiconductor die, wherein the second interconnect structure comprises a plurality of connecting pads disposed in a peripheral region around the first semiconductor die;
   forming a plurality of first connecting elements on the plurality of connecting pads, respectively;
   providing a substrate comprising a plurality of second connecting elements disposed on a mounting surface of the substrate; and
   mounting the die stack onto the mounting surface of the substrate, wherein the plurality of first connecting elements are electrically connected to the plurality of second connecting elements through an anisotropic conductive structure, wherein the anisotropic conductive structure is disposed between the plurality of first connecting elements and the plurality of second connecting elements.

11. The method according to claim 10, wherein the anisotropic conductive structure comprises an anisotropic conductive film.

12. The method according to claim 10, wherein the anisotropic conductive structure comprises an anisotropic conductive paste.

13. The method according to claim 10, wherein the substrate comprises a package substrate.

14. The method according to claim 10, wherein the substrate comprises a flexible printed circuit (FPC) substrate.

15. The method according to claim 10, wherein the plurality of first connecting elements comprise a front side metal layer.

16. The method according to claim 15, wherein the front side metal layer comprises copper, nickel, gold or any combinations thereof.

17. The method according to claim 10, wherein the anisotropic conductive structure covers sidewalls of the plurality of first connecting elements and sidewalls of the plurality of second connecting elements.

18. The method according to claim 10, wherein the anisotropic conductive structure is in direct contact with the second semiconductor die having a second interconnect structure.

* * * * *